United States Patent
El Hayek et al.

(10) Patent No.: US 11,408,944 B2
(45) Date of Patent: Aug. 9, 2022

(54) ESTIMATION OF THE REMAINING USEFUL LIFE OF CAPACITORS

(71) Applicant: Schneider Electric Industries SAS, Rueil Malmaison (FR)

(72) Inventors: Antoine El Hayek, Villeurbanne (FR); Radoslava Mitova, Meylan (FR); Miao-xin Wang, Montbonnot Saint Martin (FR); Pascal Venet, Saint Jean de Niost (FR); Guy Clerc, Ecully (FR); Ali Sari, Vaulx en Velin (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 0 days.

(21) Appl. No.: 16/878,499

(22) Filed: May 19, 2020

(65) Prior Publication Data

US 2020/0379057 A1    Dec. 3, 2020

(30) Foreign Application Priority Data

May 28, 2019    (EP) ..................... 19305671

(51) Int. Cl.
*G01R 31/64* (2020.01)
*H02J 7/00* (2006.01)

(52) U.S. Cl.
CPC ............ *G01R 31/64* (2020.01); *H02J 7/0048* (2020.01)

(58) Field of Classification Search
CPC ... G01R 31/64; G01R 31/016; G01R 27/2605
See application file for complete search history.

(56) References Cited

U.S. PATENT DOCUMENTS

| | | | |
|---|---|---|---|
| 2009/0112493 A1 | 4/2009 | Abdennadher et al. | |
| 2010/0007361 A1* | 1/2010 | Yamanaka | H02J 1/14 |
| | | | 324/678 |

(Continued)

FOREIGN PATENT DOCUMENTS

| | | |
|---|---|---|
| CN | 106597176 | 4/2017 |
| DE | 102004035723 | 2/2006 |

(Continued)

OTHER PUBLICATIONS

English Language Machine Translation of German Patent Application Publication No. DE102004035723 published on Feb. 16, 2006, 14 pages.

(Continued)

*Primary Examiner* — Benyam Haile
(74) *Attorney, Agent, or Firm* — Locke Lord LLP

(57) ABSTRACT

A method for determining a value representative of the remaining useful life, RUL, of a capacitor, the method comprising the following operations:
  repeating for several iterations 1 to k, k being an integer greater than 1:
    acquiring environment measurements that are representative of the environment of the capacitor at a current iteration;
  based on previous environment measurements acquired at previous iterations 1 to k−1 before the current iteration, and on the received environment measurements at iteration k, calculating at least one aging model;
  based on the at least one calculated aging model, determining the value representative of the RUL of the capacitor.

22 Claims, 9 Drawing Sheets

(56) References Cited

U.S. PATENT DOCUMENTS

| | | | |
|---|---|---|---|
| 2016/0356837 A1 | 8/2016 | Nakao et al. | |
| 2016/0377565 A1* | 12/2016 | Mollov | G01R 31/64 324/441 |
| 2017/0336463 A1* | 11/2017 | Makdessi | G01R 31/64 |
| 2020/0363480 A1* | 11/2020 | Schnell | G01R 27/2605 |

FOREIGN PATENT DOCUMENTS

| | | |
|---|---|---|
| DE | 102012105198 | 12/2013 |
| EP | 3109648 | 12/2016 |
| WO | WO2013107497 | 7/2013 |
| WO | WO2015183250 | 12/2015 |

OTHER PUBLICATIONS

English Language Machine Translation of Chinese Patent Application Publication No. CN106597176 published on Apr. 26, 2017, 19 pages.

English Language Machine Translation of German Patent Application Publication No. DE102012105198 published on Dec. 19, 2013, 17 pages.

Kulkarni, C. et al., "Prognostics of Power Electronics, methods and validation experiments", Institute for Software ntegrated Systems, Vanderbilt University, SGT Inc., NASA Ames Research Center, 2012, 6 pages.

Vogelsberger, M.A. et al., "Life-Cycle Monitoring and Voltage-Managing Unit for DC-Link Electrolytic Capacitors in PWM Converters", IEEE Transactions on Power Electronics, vol. 26, No. 2, Feb. 2011, pp. 493-503.

Venet, P. et al., "Realization of a Smart Electrolytic Capacitor Circuit Electrolytic capacitor circuits that can signal their own worn-out state have arrived", IEEE Industry Applications Magazine, Jan.-Feb. 2002, pp. 16-20.

Wohlfahrt, T. et al., "Supraharmonic Disturbances: Lifetime Reduction of Electronic Mass-Market Equipment by the Aging of Electrolytic Capacitors", Institute of Energy Systems, Energy Efficiency and Energy Economics, and Institute of Electrical Power Systems and High Voltage Engineering, 2018, 6 pages.

Extended European Search Report for European Patent Application No. 19305671.0 dated Dec. 19, 2019, 12 pages.

\* cited by examiner

US 11,408,944 B2

ESTIMATION OF THE REMAINING USEFUL LIFE OF CAPACITORS

BACKGROUND

The present invention relates to the estimation of the remaining useful life of capacitors, and in particular, while not exclusively, of electrolytic capacitors.

Capacitors are well known devices that are able to store electric energy by accumulating positive and negative charges in anodes and cathodes separated by a dielectric component.

Electrolytic capacitors are used in power converters such as electric motor drives and Uninterruptible Power System, UPS.

Electrolytic capacitors are one of the most critical electronic components. A high number of the faults in the static converters are due to electrolytic capacitors, as explained in the documents:

A. Lahyani, P. Venet, G. Grellet, & P. J. Viverge, Failure prediction of electrolytic capacitors during operation of a switch-mode power supply. IEEE Transactions on power electronics, 1998, 13(6), 1199-1207;

U.S. of A. D. of Defense, "*Military Handbook: Reliability Prediction of Electronic Equipment: MIL-HDBK217F: 2 Dec. 1991*". Department of defense, 1991;

S. Yang, A. Bryant, P. Mawby, D. Xiang, and P. Tavner, "*An industry-based survey of reliability in power electronic converters*", in 2009 IEEE Energy Conversion Congress and Exposition, 2009, p. 3151-3157.

In some power converter applications, it is recommended to replace electrolytic capacitors periodically to avoid an unscheduled stop of the whole power converter product due to a failure in the electrolytic capacitor.

In UPS products such as some Schneider Electric Galaxy series, it is recommended to replace electrolytic capacitors every five years to avoid an unscheduled stop of the whole UPS product due to a failure in the electrolytic capacitor.

However, in practice, many capacitors are replaced well before their remaining useful life is expired.

There is therefore a need to have methods and tools that allow monitoring of environment conditions and/or predicting of the remaining useful life RUL of a capacitor, so as to plan the maintenance on time and warn an operator/user when a capacitor needs to be changed.

A real capacitor can be seen as equivalent to a resistance, named Equivalent Series Resistance, ESR, in series with a capacitance, named Capacitance C.

The prior art solutions then propose to evaluate the RUL based on ESR and C, as for example detailed in:

P. Venet, H. Darnand and G. Grellet, "*Detection of faults of filter capacitors in a converter. Application to predictive maintenance*", in Proceedings of Intelec 93: 15th International Telecommunications Energy Conference, 1993, vol. 2, p. 229-234 vol. 2;

P. Venet, F. Perisse, G. Grellet, & G. Rojat. Condensateur intelligent. *De ande de brevet francaise FR 99 10 292*, 1999.

K.-W. Lee, M. Kim, J. Yoon, S. B. Lee, and J.-Y. Yoo, "*Condition monitoring of DC-link electrolytic capacitors in adjustable-speed drives*", IEEE Trans. Ind. Appl., vol. 44, no 5, p. 1606-1613, 2008;

K. Abdennadher, P. Venet, G. Rojat, J.-M. Rétif and C. Rosset, "*A real-time predictive-maintenance system of aluminum electrolytic capacitors used in uninterrupted power supplies*", IEEE Trans. Ind. Appl., vol. 46, no 4, p. 1644-1652, 2010.

In prior art solutions, RUL of capacitors is estimated by building, in a preliminary phase, an ageing model for each capacitor version. The ageing model is constructed offline and requires other than time (several months), many measurements, dedicated equipment, many computations and hardware components, which makes this solution complicated, expensive and unsuitable for industrial application.

When a new version of a capacitor is introduced, the aging model for this capacitor needs to be constructed again to be able to estimate the RUL.

FIG. 1 illustrates a method of estimating a RUL of a capacitor according to the prior art.

The method comprises a preliminary phase 100 of calculating/constructing an aging model.

Preliminary phase 100 comprises the following steps:

based on specific values such as a maximum temperature value and a maximum voltage value of the capacitor, accelerated aging tests are performed at step 101 on the capacitor to determine the evolution of the ESR and C values over time;

capacitor parameters are obtained at step 102. These parameters are specific to the capacitor version;

based on the ESR and C values and on the capacitor parameters, an ESR aging model and a C aging model are constructed at step 103. Based on these models, and based on a current ESR or C value, a RUL can be directly determined;

the constructed ESR and C models are stored at step 104 in a storage in association with the version of the capacitor. Therefore, steps 101 to 104 need to be performed for each capacitor version, which is long and costly.

A current phase 110 of estimation of a RUL for a capacitor of a given version, comprises the following steps according to the prior art:

at step 111, based on current measurement of values, current values of ESR and C are determined at step 112;

at step 112, ESR and C models corresponding to the capacitor version are retrieved from the storage;

at step 113, the current ESR and C values are respectively compared with the retrieved models to extract two RUL values;

at step 114, a capacitor RUL is determined based on the two extracted RUL values.

Therefore, determination of a capacitor RUL lacks flexibility as models need to be calculated and stored for each capacitor version.

There is a need to determine the RUL of a capacitor, which requires less computation capabilities and which is more flexible than the solutions of the prior art.

SUMMARY OF INVENTION

It is an object of the invention to alleviate at least some of the disadvantages mentioned above.

A first aspect of the invention concerns a method for determining a value representative of the remaining useful life, RUL, of a capacitor, the method comprising the following operations:

repeating for several iterations 1 to k, k being an integer greater than 1:
  acquiring environment measurements that are representative of the environment of the capacitor at a current iteration;
  based on previous environment measurements acquired at previous iterations 1 to k−1 before the current iteration k, and on the received environment measurements at iteration k, calculating at least one aging model;

based on the at least one calculated aging model, determining the value representative of the RUL of the capacitor.

According to some embodiments, the environment measurements may comprise:

a temperature measurement in the vicinity of the capacitor;

a voltage measurement representative of a value of the voltage at terminals of the capacitor; and/or a current measurement representative of a value of the current flowing through the capacitor.

In complement, for each iteration, a core temperature of the capacitor may be determined based on a measured ambient temperature in the vicinity of the capacitor, and the aging model may be calculated based on the core temperature, based on the current value and/or based on the voltage value.

According to some embodiments, the method may further comprise the estimation of an Equivalent Series Resistance, $ESR_i$, value and/or of a capacitance $C_i$, value, for each iteration i, i being comprised between 1 and k, and at least one aging model may represent the evolution of the ESR value of the capacitor for iterations 1 to k and/or the evolution of the C value of the capacitor for iterations 1 to k.

In complement, a first aging model may represent the evolution of an ESR value of the capacitor for iterations 1 to k and a second aging model represents the evolution of the C value of the capacitor for iterations 1 to k.

In complement, the ESR value and/or the C value may be obtained by filtering the value of the voltage at the terminals of the capacitor and the value of the current flowing through the capacitor.

In complement, the C value may be obtained by applying a band-pass filter at low frequencies and/or the ESR value is obtained by applying a band-pass filter at middle frequencies.

In complement, the low frequencies may include 120 Hz and the middle frequencies may include 15 kHz; or the low frequencies may include 300 Hz and the middle frequencies may include 4 kHz.

According to some embodiments, the aging model may comprise at least one impedance value and a time for each iteration, the impedance value being determined based on the current value and on the voltage value, and the impedance value, for each iteration i, is adjusted based on a temperature value corresponding to iteration i and based on reference conditions.

In complement, the temperature value may be a core temperature of the capacitor $T_{c,j}$, calculated for each iteration i based on a temperature measurement $T_{amb,i}$ representative of the ambient temperature in the vicinity of the capacitor.

In complement, the core temperature $T_{c,j}$ may be calculated as follows:

$$T_{c,i} = T_{amb,i} + \mathcal{R}_{th} \cdot I_{RMS,i}^2 \cdot ESR_i$$

wherein $I_{RMS}$ is a Root Mean Square value of the current flowing through the capacitor for iteration i;

$R_{th}$ is a thermal resistance of the capacitor; and $ESR_i$ is an Equivalent Series Resistance value of the capacitor for iteration i.

In complement, or alternatively, for each iteration i, the impedance value may comprise the $ESR_i$ value and/or the $C_i$ value, and the $ESR_i$ value and/or the $C_i$ value may be adjusted according to core temperature $T_{c,i}$ to determine adjusted value $ESR_{i,adjusted}$ and/or $C_{i,adjusted}$ based on for example:

$$ESR_{i,adjusted} = \frac{ESR_k}{\beta_1 + \beta_2 e^{\frac{-T_{c,i}}{\beta_3}}}$$

$$C_{i,adjusted} = \frac{C_i}{\beta_4 + \beta_5 \cdot T_{c,i}}$$

wherein $\beta_1$, $\beta_2$, $\beta_3$, $\beta_4$, and $\beta_5$ are constants.

In complement, the method may further comprise a preliminary phase of determining $\beta_1$, $\beta_2$, $\beta_3$, $\beta_4$, and $\beta_5$ by varying temperature conditions during a test period and performing current and voltage measurements during the test period.

According to some embodiments, the aging model may comprise at least one impedance value and a time for each iteration, the impedance value being determined based on the current value and on the voltage value, and the time, for each iteration i, may be adjusted based on a temperature value, a current value and/or a voltage corresponding to iteration i and based on reference conditions.

In complement, the time for each iteration i may be adjusted based on a combination of one or several of the following factors $K_{T,i}$, $K_{I,i}$, $K_V$ and $K_{TI,i}$:

$$K_{T,i} = 2^{\frac{T_0 - T_{x,i}}{10}};$$

$$K_{I,i} = K_r^{\left(1 - \left(\frac{I_{RMSx,i}}{I_{RMS0}}\right)^2\right)\frac{\Delta T_0}{10}}$$

$$K_V = \left(\frac{V_0}{V_{x,i}}\right)^n$$

$$K_{TI,i} = e^{\frac{E_a}{kb}\left(\frac{1}{T_{x,i} + \Delta T_{x,i}} - \frac{1}{T_0 + \Delta T_0}\right)}$$

wherein $T_0$ is a reference temperature, $T_{x,i}$ is a core temperature of the capacitor for iteration i, $K_r$ is a factor that depends on $I_{RMSx,i}$, $I_{RMS0}$ is a reference value of current flowing through the capacitor, $I_{RMSx,i}$ is an actual value of current flowing through the capacitor for iteration i, $\Delta T_0$ is a predefined value of core temperature increase, $V_0$ is a reference value of voltage at the capacitor, $V_{x,i}$ is an actual value of voltage at the capacitor for iteration i, n is a predefined integer, $E_a$ is an activation energy of the capacitor, kb is the Boltzmann constant.

According to some embodiments, the at least one aging model may be updated at each iteration i based on the previous ageing model determined at iteration i−1 and based on the environment measurements acquired at iteration i, and the value representative of the RUL may be determined after each iteration i, i being comprised between 1 and k.

According to some embodiments, the value representative of the RUL of the capacitor may be determined by extrapolating values of the at least one aging model and by comparing the extrapolated values with at least one predetermined threshold.

According to some embodiments, the value representative of the RUL of the capacitor may be:

a ratio between the calculated RUL of the capacitor based on the aging model, and an estimated end of life based on the aging model; or a ratio between the calculated RUL of the capacitor based on the aging model, and a predetermined end of life.

According to some embodiments, the method may further comprise:

comparing the value representative of the RUL with a predetermined threshold; and issuing an alarm based on the comparison.

According to some embodiments, the RUL of the capacitor may be determined for reference conditions and the value representative of the RUL:

is directly derived from the RUL of the capacitor; or is derived from an actual RUL, noted $RUL_x$ obtained by adjusting the RUL of the capacitor, noted $RUL_0$, to actual conditions.

In complement, the reference conditions may be set by a user.

A second aspect of the invention concerns a non-transitory computer readable storage medium, with a computer program stored thereon, said computer program comprising instructions for, when executed by a processor, carrying out the steps of a method according to the first aspect of the invention.

A third aspect of the invention concerns a device for determining a value representative of the remaining useful life, RUL, of a capacitor, the device comprising a memory and a processor configured for:

repeating for several iterations 1 to k, k being an integer greater than 1:

acquiring, via at least one sensor or at least one communication interface, environment measurements that are representative of the environment of the capacitor at a current iteration;

based on previous environment measurements acquired at previous iterations 1 to k−1 before the current iteration k, and on the received environment measurements at iteration k, calculating the at least one aging model;

based on the at least one updated aging model, determining the value representative of the RUL of the capacitor.

Further objects, aspects, effects and details of the invention are described in the following detailed description of number of exemplary embodiments, with reference to the drawings.

BRIEF DESCRIPTION OF DRAWINGS

By way of example only, the embodiments of the present disclosure will be described with reference to the accompanying drawing, wherein.

DETAILED DESCRIPTION

Figure 1:
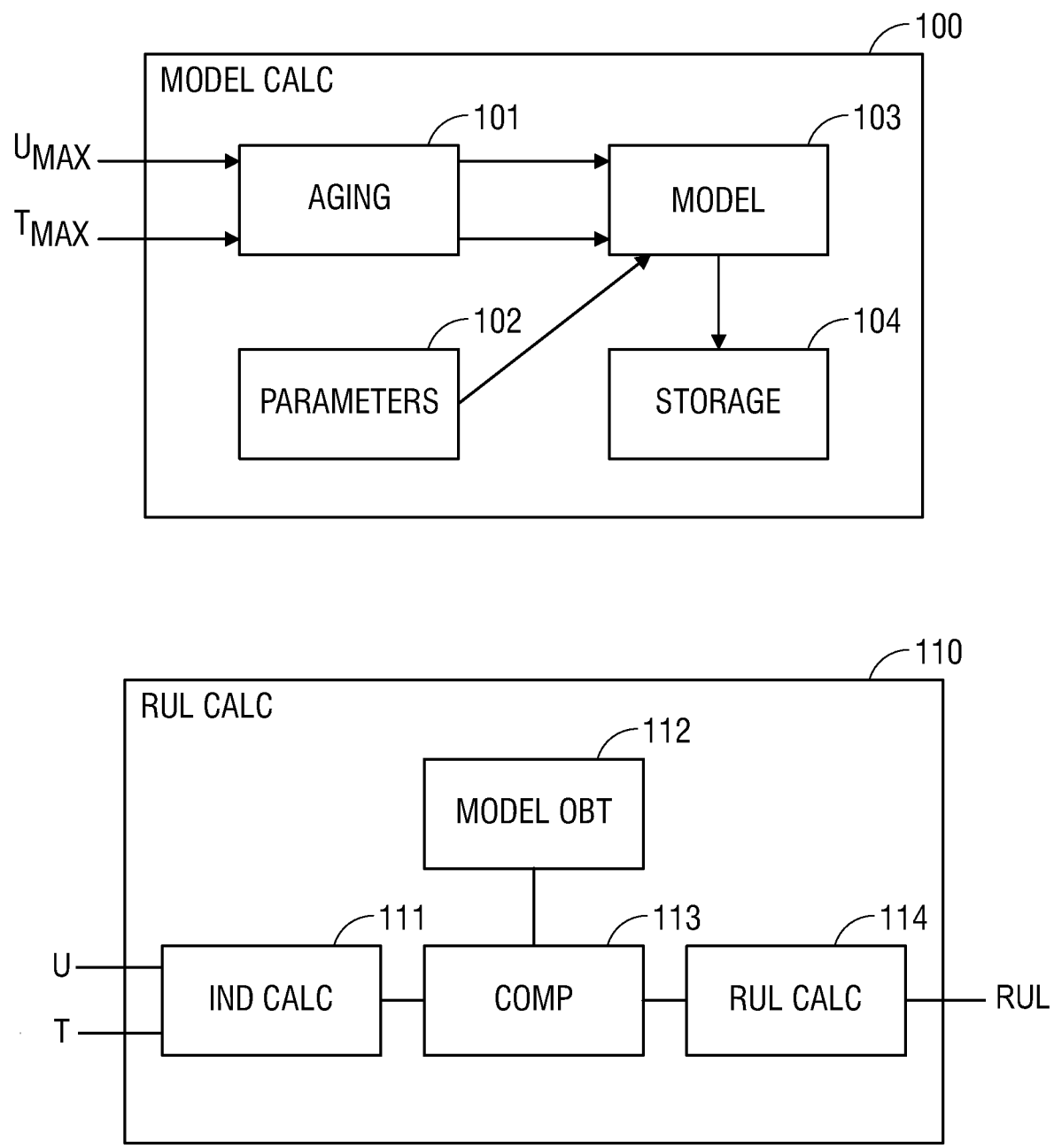
FIG. 1 illustrates a method according to the prior art.
Figure 2:
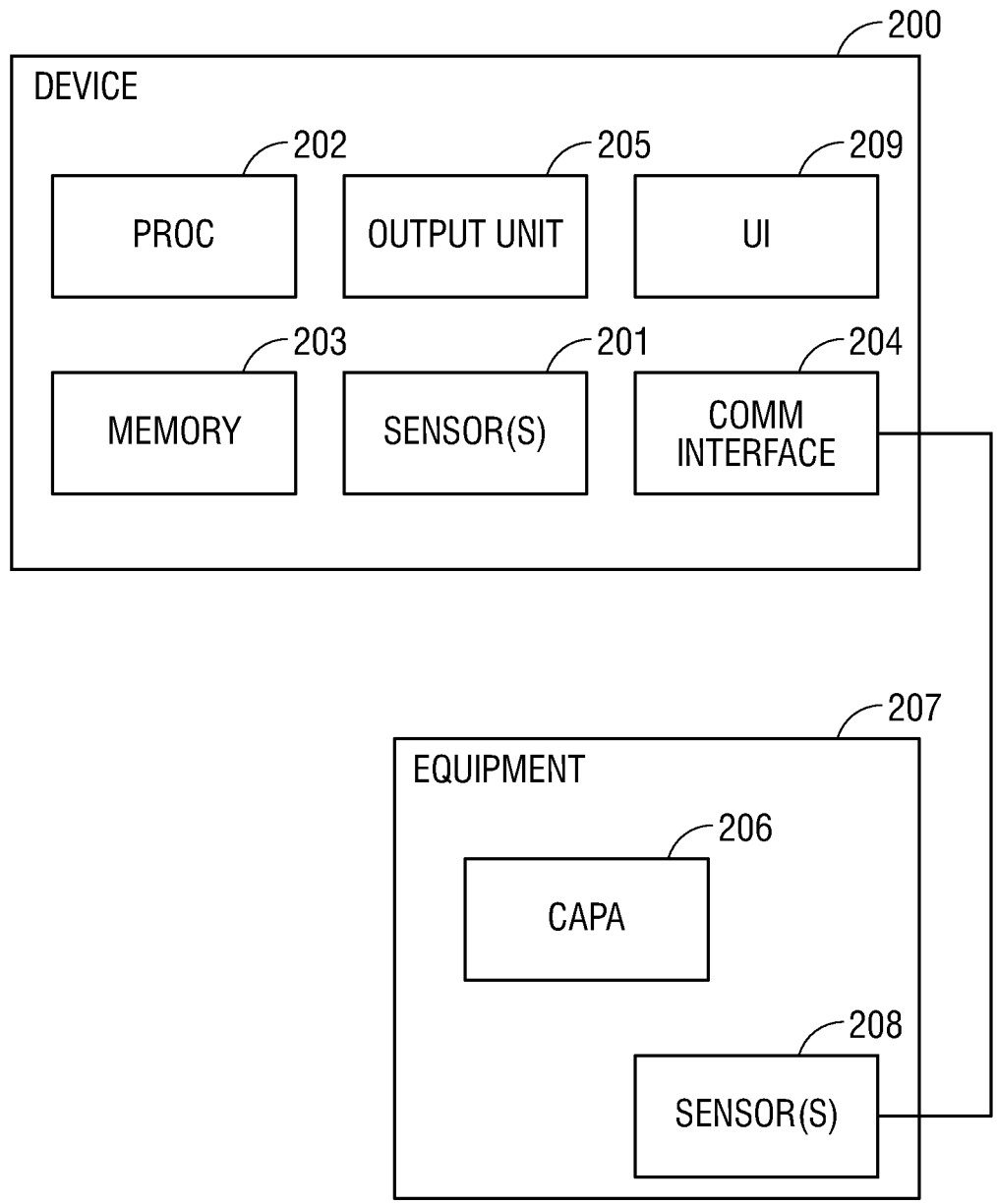
FIG. 2 represents a device according to some embodiments of the invention.

Referring to FIG. 2, there is shown a device 200 for estimating RUL of a capacitor 206 (hereafter "capacitor RUL") according to some embodiments of the invention. The device 200 can be integrated in a system comprising a capacitor. The capacitor 206 can be integrated in a larger equipment 207 such as a converter for example. No restriction is attached to the equipment 207, which can be any equipment integrating a capacitor.

The device 200 may comprise at least one sensor 201 that is configured for acquiring environment measures representative of the environment of the capacitor 206 at a current time.

Alternatively, and preferably, the device may comprise a communication interface 204 that is configured for communicating with one or several remote sensors 208 located in the vicinity of the capacitor 206, for example inside the equipment 207. For example, in most of converters comprising capacitors, an ambient temperature sensor is natively integrated. Else, one can be added at a low cost. It is to be noted that the external sensors 208 may be located outside of the equipment 207.

Sensors 201 and 208 are configured for acquiring environment measurements related to the capacitor 206.

Therefore, environment measurements can be acquired by the device 200 via the sensor 201 and/or via the communication interface 204.

The sensors 201 and/or 208 may be temperature sensors, current sensors and/or voltage sensors for example. However, no restriction is attached to the type of sensors and these examples are given for illustrative purposes. The ripple current $i_C$ of the capacitor 206 can be deduced by an algorithm based on input and output currents of the converter and switch states. Alternatively, sensor 201 and/or 208 directly measuring the ripple current $i_C$ may be used.

The device 200 may further comprise a user interface 209 for interacting with a user. In particular, the user interface 209 may allow a user to set reference conditions or to select a value representative of the RUL of the capacitor among several possible values.

Figure 3:
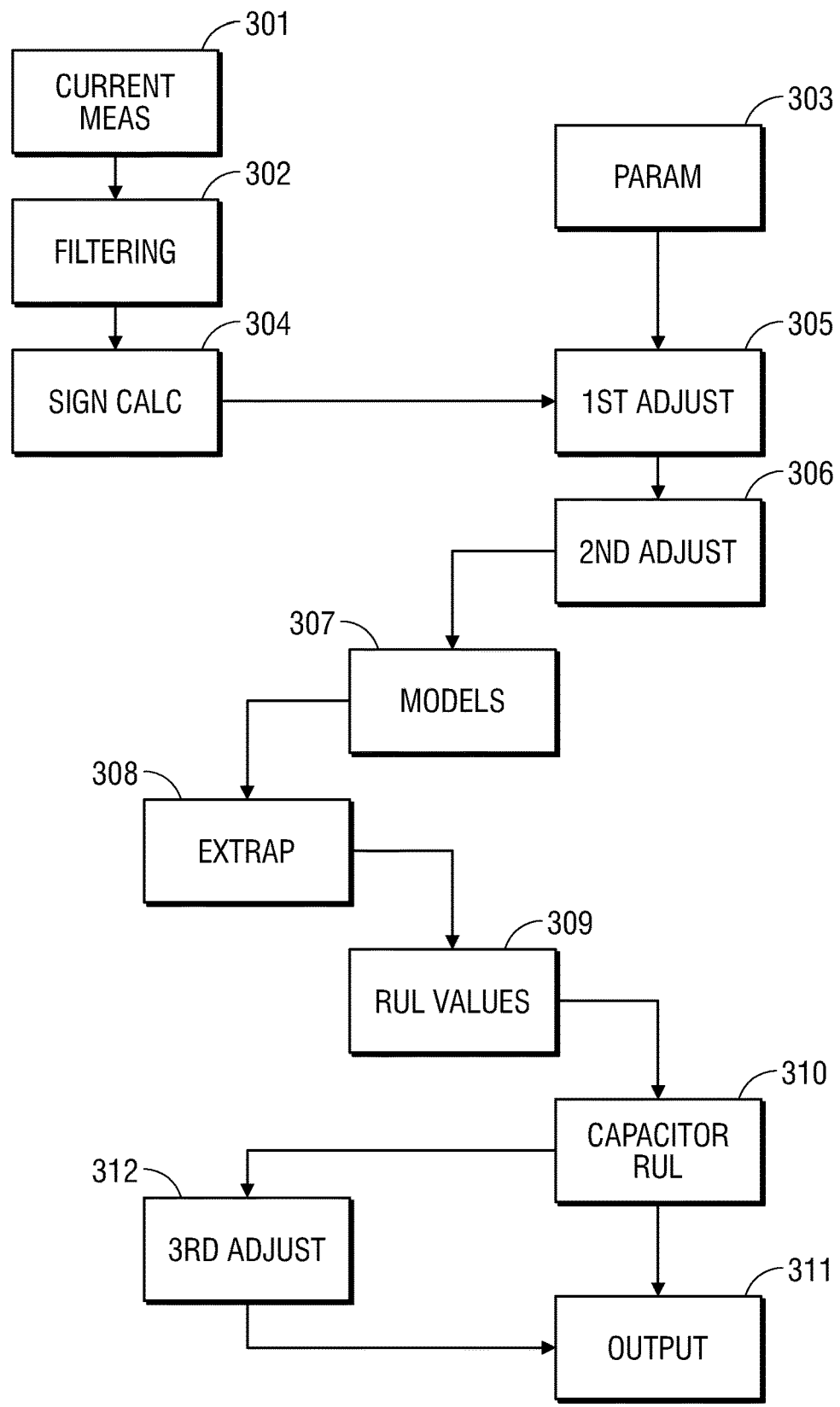
FIG. 3 is a flowchart showing the steps of a method according some embodiments of the invention.

The device 200 may further comprise a processor 202 and a memory 203, which are configured for performing the steps of the method illustrated in FIG. 3.

FIG. 3 is a flowchart showing the steps of a method according to some embodiments of the invention. The steps of FIG. 3 are iterated according to the invention. In what follows, there is referred to an iteration k, k being an integer greater than or equal to 1. No restriction is attached to the time duration between consecutive iterations. These time durations can be fixed (environment measurements performed at a given frequency, such as every 1000 hours for example) or may vary (triggered by an event detection for example).

At step 301, the device 200 acquires (measures via sensors 201 or receives from external sensors 208 via the communication interface 204) environment measures representative of the environment of the capacitor 207 at a current time. The environment measurements may include environment features such as an ambient temperature around the capacitor 206, a voltage at terminals of the capacitor 206 or at terminals of the equipment 207, and a current flowing through the capacitor 206 (named "ripple current" hereafter) or through the equipment 207. When the current running through, or the voltage at, the equipment is measured, the ripple current or the capacitor voltage can be deduced from the measured value(s) based on the architecture of the equipment 207 integrating the capacitor 206.

Preferably, several measurements of a same environment feature are obtained at step 301. For example, several variations of the capacitor voltage and/or ripple current over a given period is obtained. The temperature, which is a less variable environment feature, may be represented by a single value (an instantaneous value or an average value over the period for example). No restriction is attached to the frequency of measurements and to the number of measurements performed for each iteration of the method according to the invention. For example, the measurements can be performed at a regular frequency, or continuously, between two iterations k and k+1. For illustrative purposes, environment measures can be acquired every 10 seconds or continuous signals can be acquired as environment measures.

At step 302, at least some of the environment measures may be filtered by at least one filter. For example, an impedance Z corresponding to the ratio between the capacitor voltage and the ripple current may be filtered. Alternatively, and preferably, as it is easier to implement, the capacitor voltage and the ripple current may be filtered separately, and the impedance Z may be calculated subsequently based on the filtered values.

Figure 4:
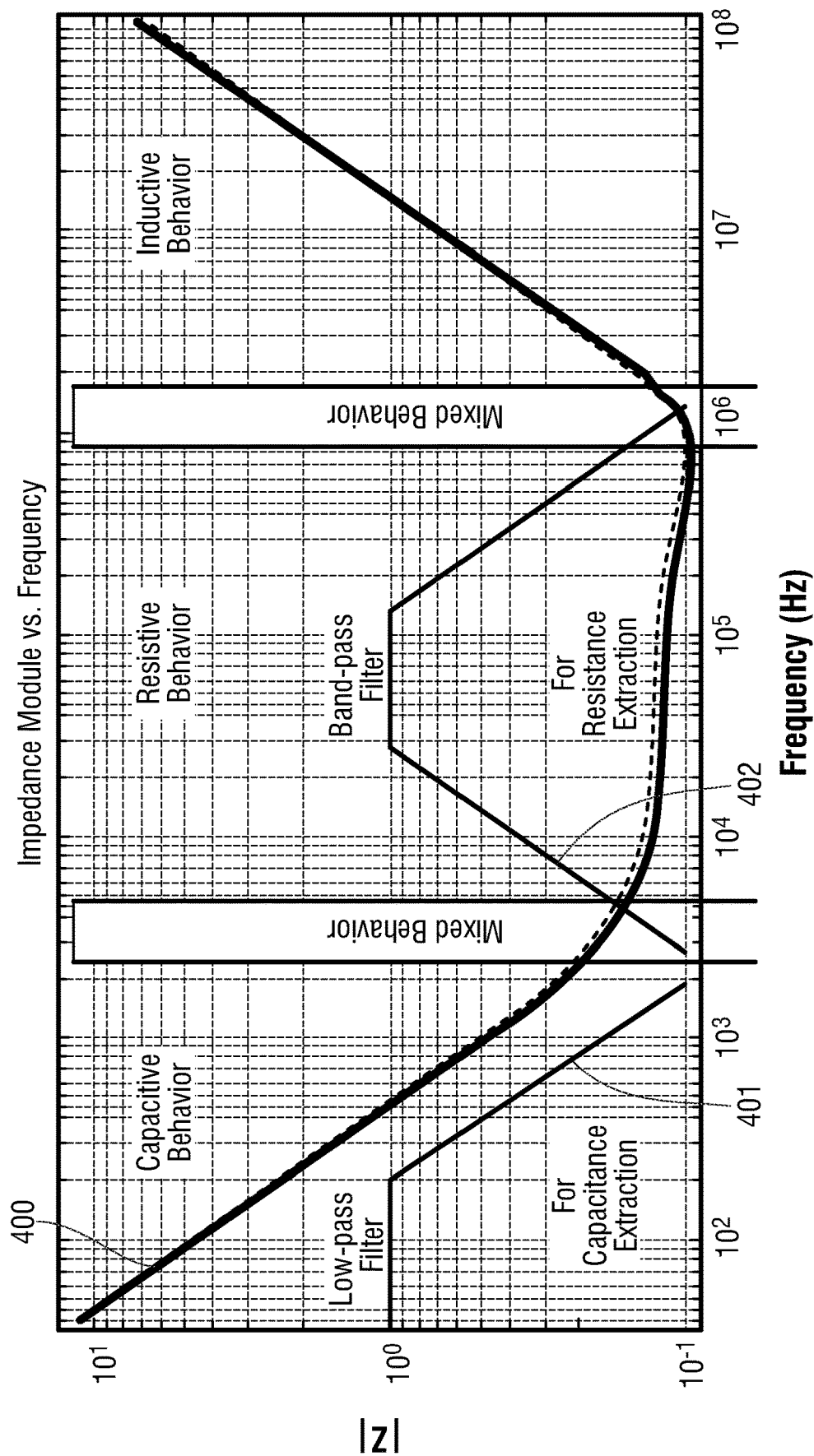
FIG. 4 is a diagram illustrating application of two filters to environment measurements acquired from the capacitor environment, according to some embodiments of the invention.

FIG. 4 illustrates evolution of impedance 300 of the capacitor 206 depending on the frequency, according to some embodiments of the invention.

By applying a band-pass filter 401 in low frequencies (for example between 0 and 1 kHz or 2 kHz, more generally less than several kHz) to the impedance Z, the capacitance C of the capacitor 206 can be calculated. Indeed, at low frequencies, the capacitor 206 has a capacitive behavior and thus the low frequencies band-pass filter 401 allows the estimation of the capacitance value C of the capacitor 206. As shown in FIG. 4, the low frequencies band-pass filter 401 may exclude frequencies above 1 kHz, in particular above 2 kHz. This is given as illustrative purposes and do not restrict the scope of the invention. The low frequencies band-pass filtering can be a band-pass filtering centered around a low frequency, such as 120 Hz for example.

By applying a middle frequencies band-pass filter to the impedance Z, the ESR of the capacitor 206 can be estimated. Indeed, at middle frequencies, the capacitor 206 has a resistive behavior and thus the band-pass filter allows the estimation of the ESR of the capacitor. As shown in FIG. 4, the middle frequencies band-pass filter may only allow frequencies between 5 kHz and 800 kHz. This is given for illustrative purposes and does not restrict the scope of the invention.

Alternatively, the band-pass filters (at low frequencies and mid-frequencies) can be applied to the ripple current and to the measured voltage separately, and the impedance can be subsequently calculated based on the filtered ripple current and the filtered voltage. In that embodiment, a ripple current signal and a measured voltage signal are filtered and then the filtered signals may be processed to calculate a Root Mean Square, RMS, value for each signal or to obtain an image of the effective value such as the peak value of each of the filtered signals or the average value over one half cycle (positive for exemple) of each of the filtered signals. $1/2\pi f \cdot C$ then corresponds to the ratio of the RMS values or of the images when filtered by the first filter and ESR corresponds to the ratio of the RMS values or of the images when filtered by the second filter.

A low-pass filter can also be applied to the measured voltage signal to extract a DC voltage value $U_{DC}$.

The filters can be digital filters that are stored in the memory 203 or may be an electronic circuit of the device 200.

After filtering the ripple current $i_C$ and the voltage u at low and middle frequencies, for iteration k, and calculating the RMS values $U_{rms}$ and $I_{rms}$, the following table, which is given as an example, can be obtained:

| Iteration index | Time (hours) | T (° C.) | $U_{dc}$ (V) | $I_{rms}$/120 Hz (A) | $U_{rms}$/120 Hz (V) | $I_{rms}$/15 kHz (A) | $U_{rms}$/15 kHz (mV) |
|---|---|---|---|---|---|---|---|
| 1 | 0 | 45 | 500 | 2 | 6.6 | 0.2 | 43 |
| 2 | 5000 | 55 | 450 | 3 | 10.1 | 0.3 | 56 |
| 3 | 10000 | 50 | 500 | 2 | 6.8 | 0.2 | 45 |
| 4 | 15000 | 45 | 450 | 3 | 10.4 | 0.3 | 75 |
| 5 | 20000 | 55 | 500 | 1 | 3.5 | 0.1 | 26 |
| 6 | 25000 | 40 | 470 | 3 | 10.6 | 0.3 | 93 |
| 7 | 30000 | 45 | 500 | 4 | 14.3 | 0.4 | 115 |

RMS values are calculated because the current running through the capacitor 206 is alternating.

In the table, the temperature T may be a core temperature $T_{c,k}$ determined based on the temperature measurement performed at iteration k, as explained hereafter.

In that example, k is equal to 7 and the environment measurements of line 7 have been acquired at step 301 and filtered at step 302, the preceding lines 1 to 6 having been acquired at previous iterations. According to the above table, environment measurements are acquired at regular time intervals, such as every 5000 hours, or are acquired more frequently (or continuously) and then weighted and averaged to obtain a single value for each time interval between two iterations.

The low frequencies band-pass filtering is such that it enables to calculate C and the middle frequencies band-pass filtering is such that it enables to calculate ESR. Specific values are given hereafter, for illustrative purposes only. Low frequencies band-pass filtering may be performed around 120 Hz and middle frequencies band-pass filtering may be performed around 15 kHz. Alternatively, low frequencies band-pass filtering can be performed at 300 Hz and the middle frequencies band-pass filtering may be performed at 4 kHz. However, as it can be observed in FIG. 4, ESR and C cannot be obtained directly with these filtering values, as 300 Hz and 4 kHz correspond to frequencies from mixed behaviors (both capacitive and resistive behaviors). However, ESR and C can be estimated by using a system of two equations with two unknown parameters (ESR and C). No restriction is attached to the system of equations, which may express the impedance Z filtered separately by two different filters, based on C and ESR.

Referring back to FIG. 3, the method according to some embodiments of the invention further comprises a step 303 of obtaining parameters related to the version of the capacitor. Some of the parameters can be noted $\beta_j$ with j varying between 1 and n, n being an integer equal or greater than 1. Other parameters such as $R_{th}$, $E_a$, Tmax, $U_0$, $I_{RMS0}$, $\gamma 1 \ldots 3$ may also be obtained at step 303. $R_{th}$ is the thermal resistance of the capacitor. $E_a$ is the activation energy of the capacitor. $U_0$ is the maximum value of voltage allowable for the capacitor and $I_{RMS0}$ is the maximum RMS value of current allowable for the capacitor. These other parameters can be directly obtained from a manufacturer data sheet. Step 303 can be performed only once for a given capacitor and does not need to be iterated as for the other steps.

The parameters can be obtained directly from a manufacturer data sheet or can be obtained during a preliminary phase. For example, during the preliminary phase, the parameters can be calculated over a test period in a laboratory for example. The $\beta_j$ values are constants enabling to adjust ESR and C values based on the ambient or core temperature as explained hereafter.

The values $\beta_j$ can be obtained at step 303:
from a manufacturer data sheet;
from a training period, such as a one-day training period, during which the value $ESR_{adjusted}$, $C_{adjusted}$ described below are considered as fixed for a given core temperature (for example 25° C. or a maximum temperature value) and during which ESR, C and core temperature $T_c$ are estimated. The main goal is to obtain the influence of a varying temperature during a day (or more generally a period which is short enough so that aging does not influence the values ESR and C) on the estimated value of ESR an C, so that the values $\beta_j$ can be determined based on the following formula for example:

$$ESR_{adjusted} = \frac{ESR}{\beta_1 + \beta_2 e^{\frac{-T_c}{\beta_3}}}$$

$$C_{adjusted} = \frac{C}{\beta_4 + \beta_5 \cdot T_c}$$

This can be performed after commissioning of the equipment 207 and during normal operation;
from a training period, such as a one-day training period, for example before commissioning of the equipment 207, the value $ESR_{adjusted}$, $C_{adjusted}$ described below are considered as fixed for a given core temperature (for example 25° C. or a maximum temperature value) and core temperature $T_c$ is controlled to make it vary. ESR and C are measured for different temperatures so that the values $\beta_j$ can be estimated from the formula above.

At step 304, the values $ESR_k$ and $C_k$ are deduced from the impedance values obtained from the two filters, as explained above.

At step 305, a first adjustment is performed on the values $ESR_k$ and $C_k$ and on the previous values of $ESR_i$, and $C_i$, for i varying between 1 and k−1. Alternatively, the first adjustment is only applied to the values $ESR_k$ and $C_k$ and adjusted values of $ESR_i$, and $C_i$, for i varying between 1 and k−1, have been previously stored in the memory 203. The same principle applies to the second adjustment at step 306.

As an example, the first adjustment can be a measurement adjustment (meaning that the values of ESR and C calculated based on the environment measurements are adjusted). This enables to adjust the measurements performed at different times and different conditions, to similar predetermined conditions (such as temperature conditions for example). Indeed, the values $ESR_i$, and $C_i$, i varying between 1 and k, are temperature dependent and the core temperature of the capacitors varies depending on some of the environment measurements, such as the ambient temperature $T_{amb,k}$ and/or the ripple current $i_{c,k}$. First adjusted values $ESR_{k,adjusted}$ and $C_{k,adjusted}$ may be calculated as follows:

$$ESR_{k,adjusted} = \frac{ESR_k}{\beta_1 + \beta_2 e^{\frac{-T_{c,k}}{\beta_3}}}$$

$$C_{k,adjusted} = \frac{C_k}{\beta_4 + \beta_5 \cdot T_{c,k}}$$

Figure 5:
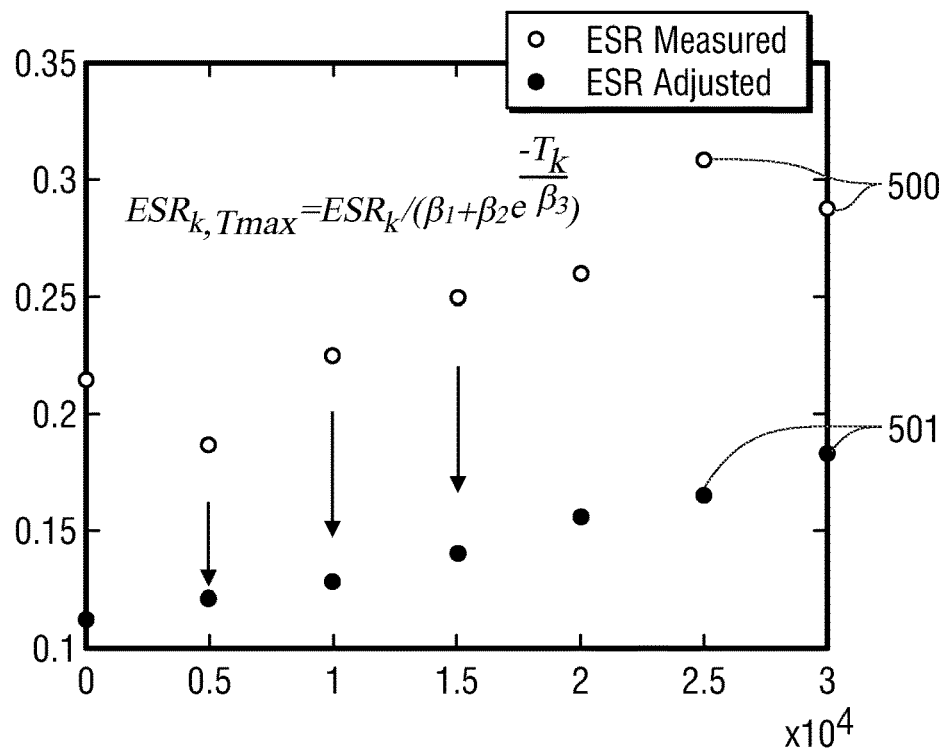
FIG. 5 illustrates adjustments of characteristic values ESR and C based on predetermined environment conditions, according to some embodiments of the invention.
Figure 5:
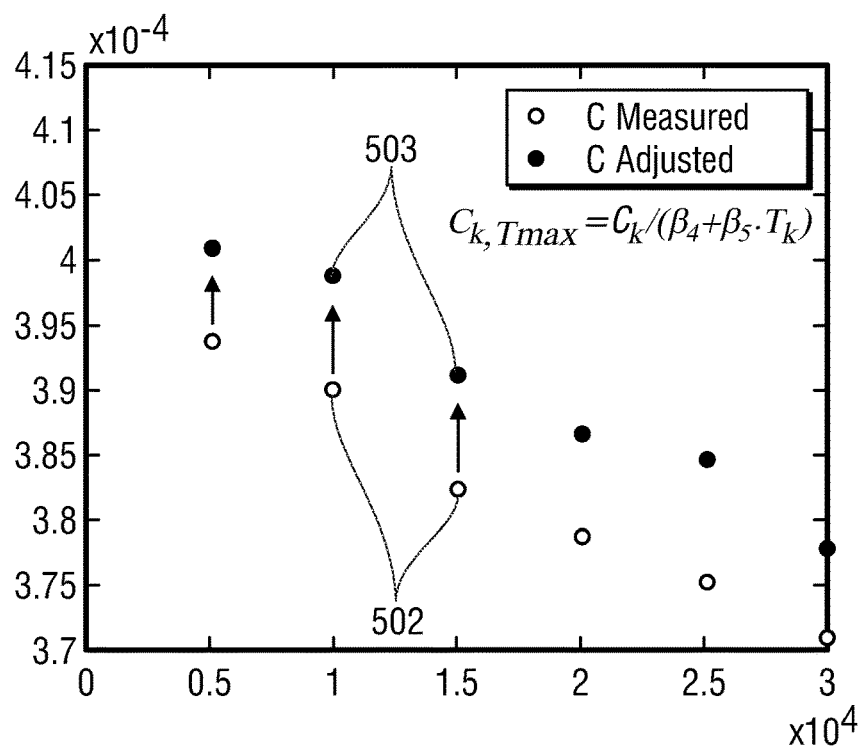

The $\beta_k$ values have been obtained at step 303 as explained above. $T_{c,k}$ is the core temperature, which can be derived from the measured ambient temperature $T_{amb}$. For example, $T_{c,k}$ can be calculated as follows:

$$T_{c,k} = T_{amb,k} + \mathcal{R}_{th} \cdot I_{RMS,k}^2 \cdot ESR_k$$

where $I_{RMS,k}$ is the RMS value calculated based on the ripple current signal $i_{C,k}$ measured or determined for iteration k and $R_{th}$ is the thermal resistance of the capacitor 206. FIG. 5 represents the first adjustment of the values $ESR_i$ and $C_i$ for i varying between 1 and k (k is equal to 7 in the above example) on a graph representing the values ESR and C depending on time. In the example of FIG. 5, the values $ESR_i$ and $C_i$ are adjusted to a reference temperature corresponding to a maximum temperature. The maximum temperature can be obtained from the manufacturer data sheet. Alternatively, the reference temperature can be set to any temperature value, such as 25° C. for example. The constants $\beta_j$ discussed above depends on the reference temperature.

The values $ESR_i$ are referenced 500 and are adjusted to obtain the adjusted values $ESR_{i,adjusted}$ 501, for example based on the formula given above. The values $C_i$ are referenced 502 and are adjusted to obtain the adjusted values $C_{i,adjusted}$ 503, for example based on the formula given above (in this example the reference temperature is the maximum temperature value).

At step 306, a second adjustment is applied to the adjusted values $ESR_{k,adjusted}$ and $C_{k,adjusted}$. In this exemplary embodiment, the second adjustment corresponds to a time compression. It is to be noted that this is given for illustrative purposes and that, alternatively, the first adjustment may correspond to the time compression and the second adjustment may correspond to the measurement adjustment (the adjustment of the values ESR and C). It is to be noted that the reference temperature $T_0$ for the first and second adjustments may be different. For example, the reference temperature $T_0$ for the second adjustment (time compression) is preferably a maximum rated temperature, even when the reference temperature for the measurement adjustment is a temperature such as 20° C. or 25° C. This also applies to reference values $\Delta T_0$, $I_{RMS,0}$, $ESR_0$ and $V_0$, which are preferably maximum rated values for the second adjustment. This allows to have a time scale, which is as compressed as possible.

It can be considered that the environment conditions are maintained between two iterations: the conditions between k−1 and k are therefore corresponding to the core temperature $T_{c,k-1}$ (or the ambient temperature $T_{x,k-1}$ measured at instant k−1), the ripple current $i_{c,k-1}$, (for example as such, or filtered by the low-frequencies band-pass filter) and/or the applied voltage $u_{k-1}$. Alternatively, the temperature can be continuously measured between iterations k−1 and k (or at a given frequency, greater than the frequency of iterations k), and an average temperature can be used as environment conditions. Alternatively, and preferably, the following factor $K_T$ is calculated for each measurement instant (possibly several times per iteration) and then an average value $K_T$ can be calculated for iteration i. This principle can be extended to the applied voltage and the ripple current or to their corresponding factors $K_{I,i}$ and $K_{V,i}$.

It is proposed for example, to calculate factors $K_{T,i}$, $K_{I,i}$, $K_{V,i}$ based on the following formulas:

Based on what the manufacturer gives:
For the temperature factor $K_{T,i}$:

$$K_{T,i} = 2^{\frac{T_0 - T_{x,i}}{10}}.$$

For the current factor $K_{I,i}$:

$$K_{I,i} = K_r^{\left(1 - \left(\frac{J_{RMSx,i}}{J_{RMS0}}\right)^2\right)\frac{\Delta T_0}{10}}$$

where $K_r$ is a predetermined empirical safety factor:

$K_r = 2$ if $I_{RMSx,i} \leq I_{RMS0}$;

$K_r = 4$ if $I_{RMSx,i} \leq I_{RMS0}$;

where $\Delta T_0$ is a core temperature increase at maximum rated temperature and $I_{RMS0}$ has been obtained at step 303. It is representative of a maximum temperature variation due to current variation (self-heating) that the capacitor can support without being degraded. $\Delta T_0$ may for example be equal to 10° C. This value is preferably predetermined.

For the voltage factor $K_{V,i}$:

$$K_V = \left(\frac{V_0}{V_{x,i}}\right)^n$$

where $V_0$ is a rated voltage that has been obtained at step 303 and $V_{x,i}$ is the actual applied operating voltage (the measured voltage) at instant i and n is a predetermined empirical safety factor. n can for example be comprised between 2 and 5. This parameter can be obtained at step 303, from a manufacturer data sheet or technical note for example.

Once the factors $K_{T,i}$, $K_{I,i}$, $K_{V,i}$ are calculated, the compression of time of each interval $\Delta time_{x,i}$ between two consecutive iterations i and i+1 (this interval being fixed to 5000 hours in the above example) can be compressed to obtain $\Delta time_{0,i}$:

$$\Delta time_{0,i} = \frac{\Delta time_{x,i}}{K_{T,i} \cdot K_{I,i} \cdot K_{V,i}}$$

As per the other notations, the index "0" refers to reference (extreme for example) environment conditions whereas "x" refers to actual environment conditions.

Figure 6:
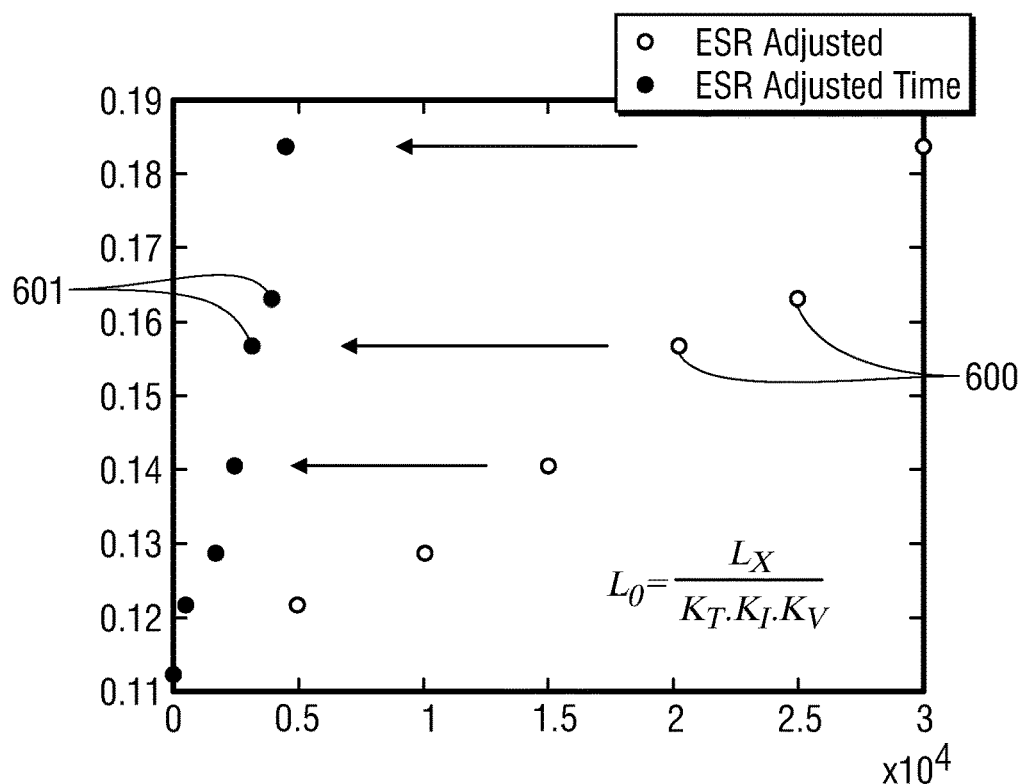
FIG. 6 illustrates time-based adjustments on predetermined environment conditions, according to some embodiments of the invention.
Figure 6:
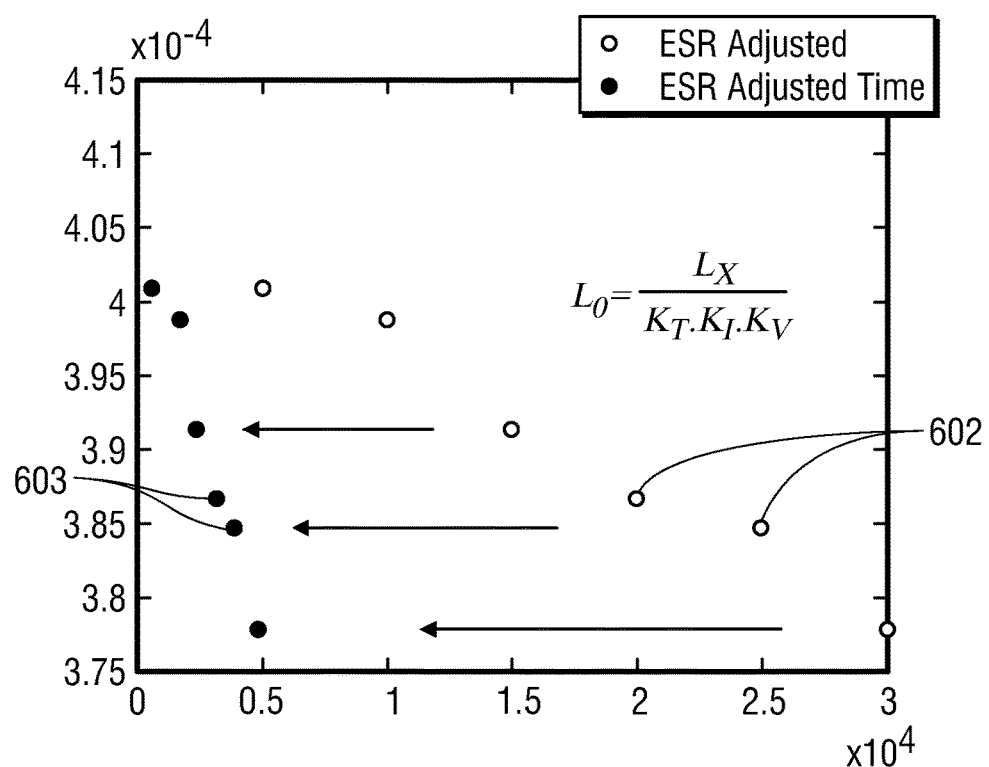

An alternative formula based on the Arrhenius law, which is more accurate than the above manufacturer formula, can be used to determine $K_{T,i}$, $K_{I,i}$, which can be noted $K_{TI,i}$:

$$K_{TI,i} = e^{\frac{E_a}{kb}\left(\frac{1}{T_{x,i} + \Delta T_{x,i}} - \frac{1}{T_0 + \Delta T_0}\right)}$$

$$K_{TI,i} = e^{\frac{E_a}{kb}\left(\frac{1}{T_x + R_{th} \cdot I_{RMS,x,i}^2 \cdot ESR_{x,i}} - \frac{1}{T_0 + R_{th} \cdot I_{RMS,0,i}^2 \cdot ESR_{0,i}}\right)}$$

where $E_a$ is the activation energy and kb the Boltzmann constant, $T_{x,i}$ is the ambient temperature in the vicinity of the capacitor at instant i, $T_0$ is the reference or maximum temperature, where $\Delta T_k = \mathcal{R}_{th} \cdot I_{RMS,k}^2 \cdot ESR_k$ FIG. 6 represents the second adjustment of $ESR_{i,adjusted}$ and $C_{i,adjusted}$ as obtained after step 306 described above, for i varying between 1 and k (k is equal to 7 in the above example) on a graph representing the values ESR and C depending on time, thereby obtaining normalized values $ESR_{i,adjusted,norm}$ and $C_{i,adjusted,norm}$.

The values $ESR_{i,adjusted}$ and $C_{i,adjusted}$ are timely adjusted to a common time reference. The values $ESR_{i,Tmax}$ are referenced 600 and are adjusted to obtain the normalized values $ESR_{i,adjusted,norm}$ 601, for example based on the formula given above. The values $C_{i,adjusted}$ are referenced 602 and are adjusted to obtain the normalized values $C_{i,adjusted,norm}$ 603, for example based on the formula given above.

At a step 307, evolution models of ESR and C are built based on the adjusted values $ESR_{i,adjusted,norm}$ and $C_{adjusted,norm}$. No restriction is attached to the way the evolution models are built. For example, an identification may involve a least square criterion. For example, the model can be determined such that the differences between the model and the adjusted values $ESR_{i,adjusted,norm}$ and $C_{i,adjusted,norm}$ are minimum according to the least square criterion. The models may be built by updating models built at the previous iteration k−1 or may be calculated based on all the measurements acquired (and optionally adjusted) between iterations 1 and k.

Figure 7:
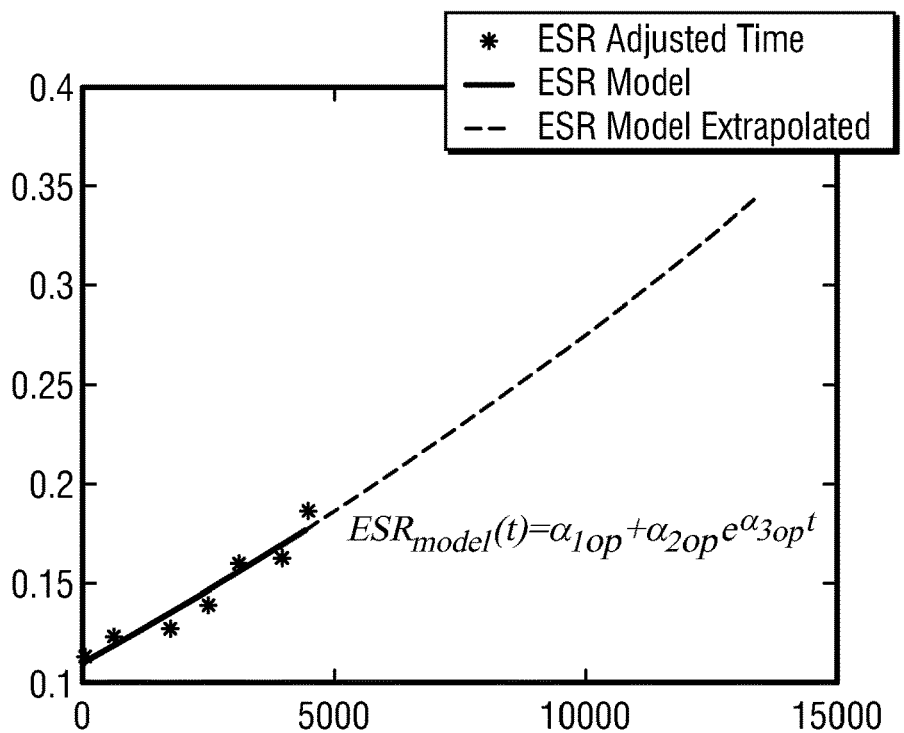
FIG. 7 illustrates calculations of models for characteristic values ESR and C according to some embodiments of the invention.
Figure 7:
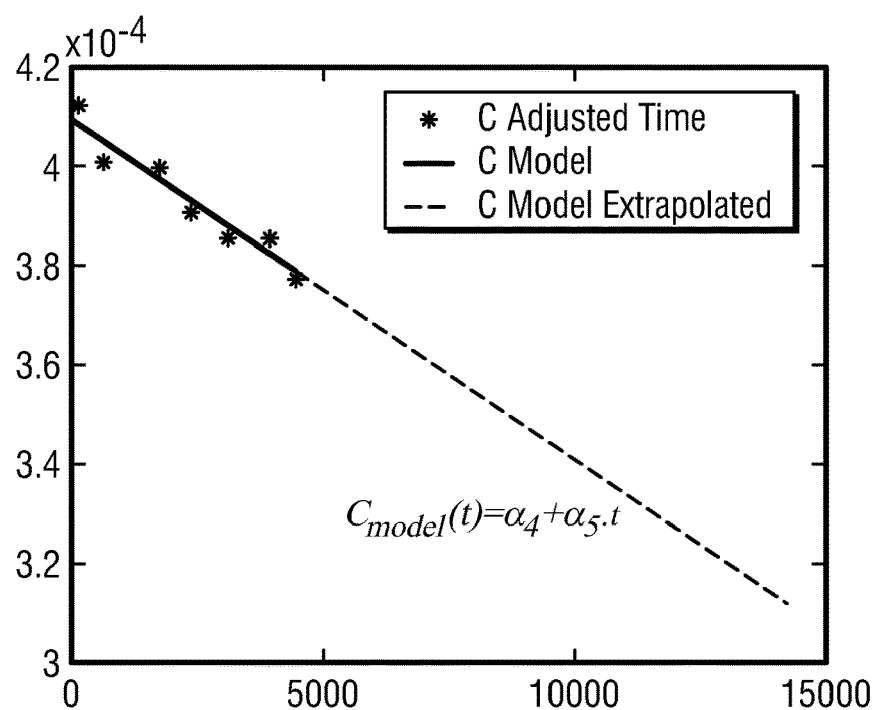

As shown in FIG. 7, the model $EST_{model(t)}$ may be in the predetermined form $ESR_{model}(t) = \alpha_1 + \alpha_2 e^{\alpha_3 t}$ and the evolution model $C_{model}(t)$ may be in the predetermined form $C_{model}(t) = \alpha_4 + \alpha_5 t$. This means that it is assumed that the evolution models have the above forms and that the evolution models are built by determining optimal values of the coefficients $\alpha_1$, $\alpha_2$, $\alpha_3$, $\alpha_4$ and $\alpha_5$. No restriction is attached to the form of the models, which can be different from what is shown in FIG. 7.

The coefficients $\alpha_1$, $\alpha_2$, $\alpha_3$, $\alpha_4$ and $\alpha_5$ are therefore calculated and updated at each new iteration k. Therefore, the evolution models (or ageing models) may be updated at each iteration, thereby becoming more and more accurate. The larger k, the more accurate are the evolution models. Alternatively, the models are only calculated once a minimum index $k_{min}$ is reached. For the previous iterations 1 to $k_{min}-1$, the measurements or adjusted values are stored for being processed ultimately.

Based on the determined models, the ESR and C curves can be extrapolated beyond the times corresponding to the iterations 1 to k, at step 308.

After the models have been built at step 307 and the $ESR_{model}(t)$model and $C_{model}(t)$ curves have been extrapolated at step 308, the method may further comprise a step 309 of estimation of RUL values. To this end, a criterion, or several criteria, can be fixed to determine the time corresponding to the end of life of the capacitor 206.

A criterion can for example be that:
the ESR value doubles compared to its initial value; and/or
the C value decreases by 20% compared to its initial value.

When a criterion is met, a time corresponding to the end of life of the capacitor according to this criterion can be deduced.

No restriction is attached to the criteria used for estimating the end of life. For example, threshold values different from those given above may be used.

The RUL values can then be computed by calculating the difference between the estimated end of life (compressed or at extreme conditions) and the compressed time of the current iteration k. "Compressed time" refers to the time of the iteration k, as compressed in FIG. 6.

Figure 8:
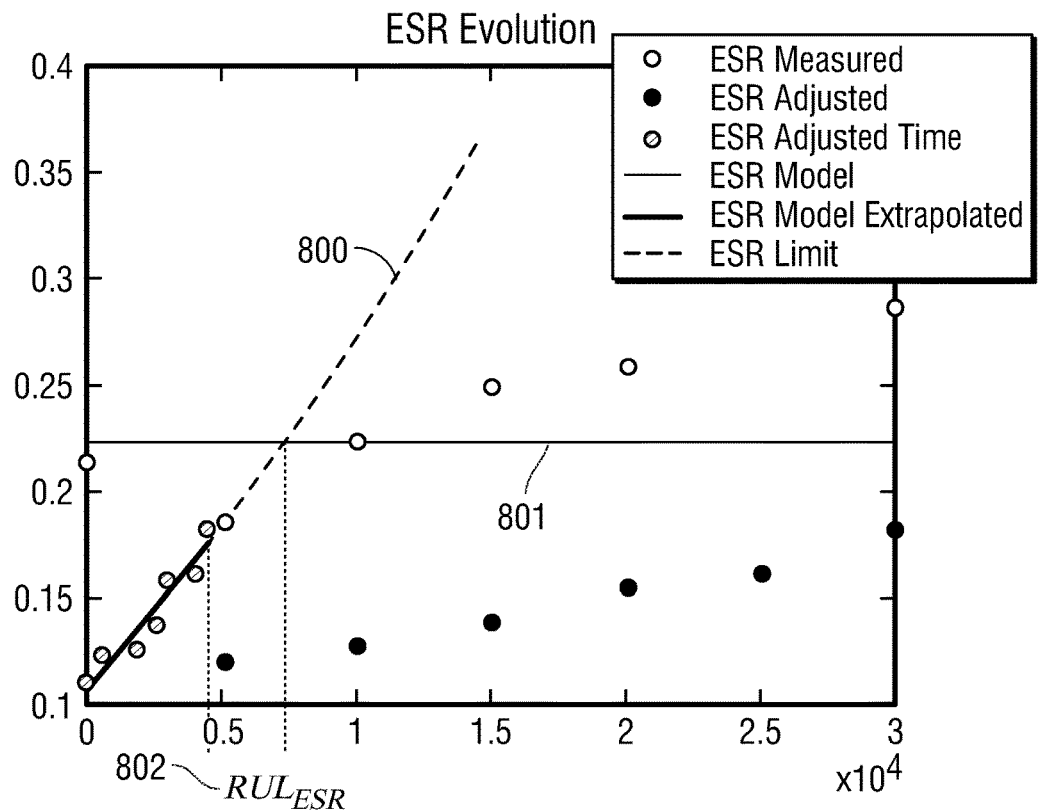
FIG. 8 illustrates calculations of RUL values according to some embodiments of the invention.
Figure 8:
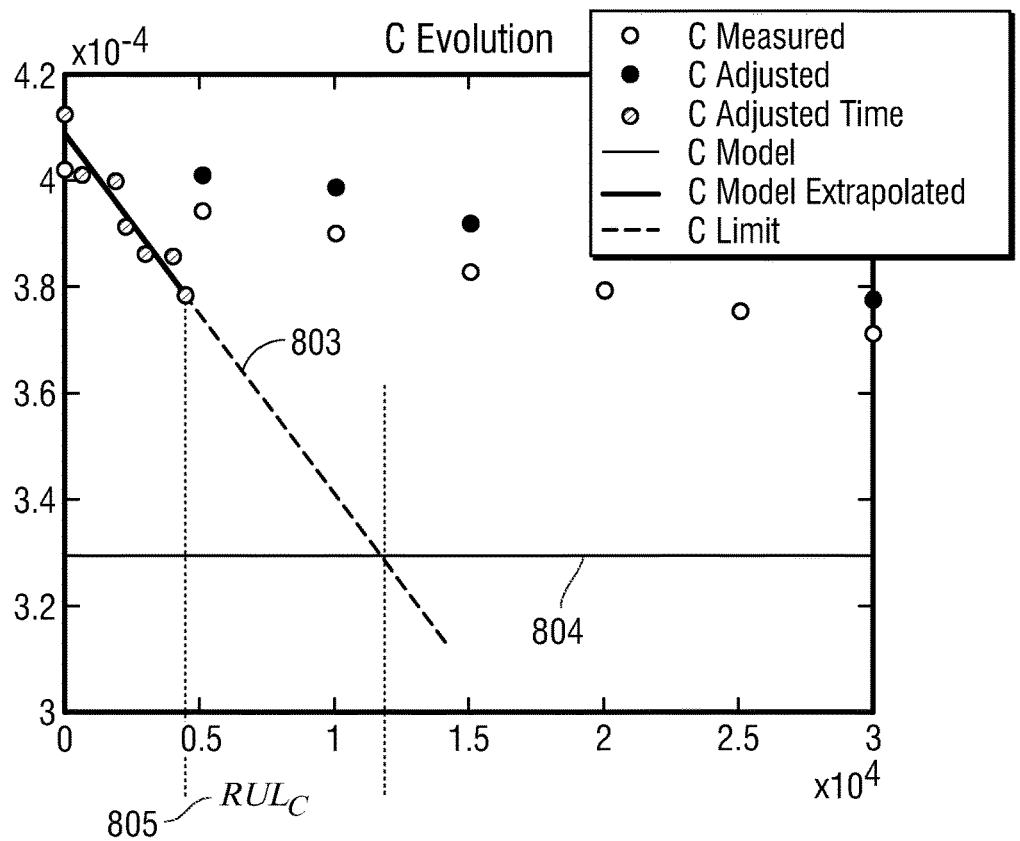

Referring to FIG. 8, there is shown the curve 800 of the ESR evolution model and the curve 803 of the C evolution model. Thresholds 801 and 804 are represented as explained above (double of the initial ESR value and 80% of the initial C value).

Two RUL values $RUL_{ESR,k}$ 802 and $RUL_{C,k}$ 805 can then be calculated (they correspond to the differences mentioned above).

The capacitor RUL can then be calculated at step 310 based on the RUL values $RUL_{ESR,k}$ 802 and $RUL_{C,k}$ 805. For example, the minimum value among the RUL values $RUL_{ESR,k}$ 802 and $RUL_{C,k}$ 805 may be selected as the capacitor RUL. Alternatively, an average of the RUL values $RUL_{ESR,k}$ 802 and $RUL_{C,k}$ 805 can be calculated as the capacitor RUL. Other calculations may be applied to the RUL values $RUL_{ESR,k}$ 802 and $RUL_{C,k}$ 805 to determine the capacitor RUL.

Because of steps 305 and 306 of adjustments to reference environment conditions (for example extreme environment conditions), the capacitor RUL, noted $RUL_0$, (or $RUL_{0,k}$ because it is determined for iteration k) is obtained for such reference environment conditions.

At step 311, an output is issued based on the capacitor RUL. The output can be a state of health value, which is transmitted to a remote entity to be displayed to an operator, or which is displayed on the device or which is used to be compared to a threshold to issue an alarm based on the comparison.

The state of health can be calculated as:
a ratio between the capacitor RUL and the end of life estimated as shown in FIG. 8 (time when the $EST_{model}(t)$ curve and/or the $C_{model}(t)$ curve reaches a threshold);
a ratio between the capacitor RUL and a predetermined end of life, such as the end of life given by the manufacturer data sheet.

A ratio is preferable as the capacitor RUL has been determined for given reference environment conditions.

An alarm can be issued at step 310 when the state of health is below a predefined alarm threshold, such as 10% or 5% for example.

The reference conditions may be set by the user of the device 200 via the user interface 209. The user may also set the alarm thresholds and may choose which value is to be output at step 311, among a set of several possible values (may for example choose between the two possible ratios mentioned above).

A step 312 of adjusting the capacitor RUL from reference environment conditions to actual environment conditions may optionally be performed before performing step 311. Indeed, the capacitor RUL calculated at step 310 has been calculated for reference environment conditions and is not representative of the actual environment conditions to which the capacitor is exposed.

The same principle as the one used in step 306 for compressing time may be used. To adjust time from reference conditions to actual condition, the effect of each environment condition may be considered (ambient temperature, ripple current and applied voltage).

$$RUL_x = RUL_0 \cdot K_T \cdot K_I \cdot K_V;$$

For example, $K_{T,k}$, $K_{I,k}$ and $K_{V,k}$ (the values for the last iteration k) can be used as $K_T$, $K_I$ and $K_V$.

$RUL_x$ represents the capacitor value at actual conditions. This value can be used instead of $RUL_0$ at step 310. $RUL_x$ can be directly output (instead of indicating a ratio) while indicating that this value corresponds to current conditions.

According to different embodiments:
steps 301 to 312 are repeated for each iteration 1 to k; or
steps 301 to 306 are repeated for iterations 1 to $k_{min}$ and the measurements or adjusted values are stored in memory, and steps 301 to 312 may be iterated for the next iterations; or
steps 301 to 306 are iterated and the measurements or adjusted values are stored in memory, and steps 307 to 312 are performed upon request of the user via the user interface; or
steps 301 to 306, are iterated and the measurements or adjusted values are stored in memory and steps 307 to 312 are performed once k reaches a predetermined value; or
steps 301 to 307 are iterated and the latest (updated) versions of the models are stored in memory, and steps 308 to 312 are performed upon request of the user via the user interface; or
steps 301 to 307 are iterated and the latest (updated) versions of the models are stored in memory, and steps 308 to 312 are performed once k reaches a predetermined value.

Figure 9:
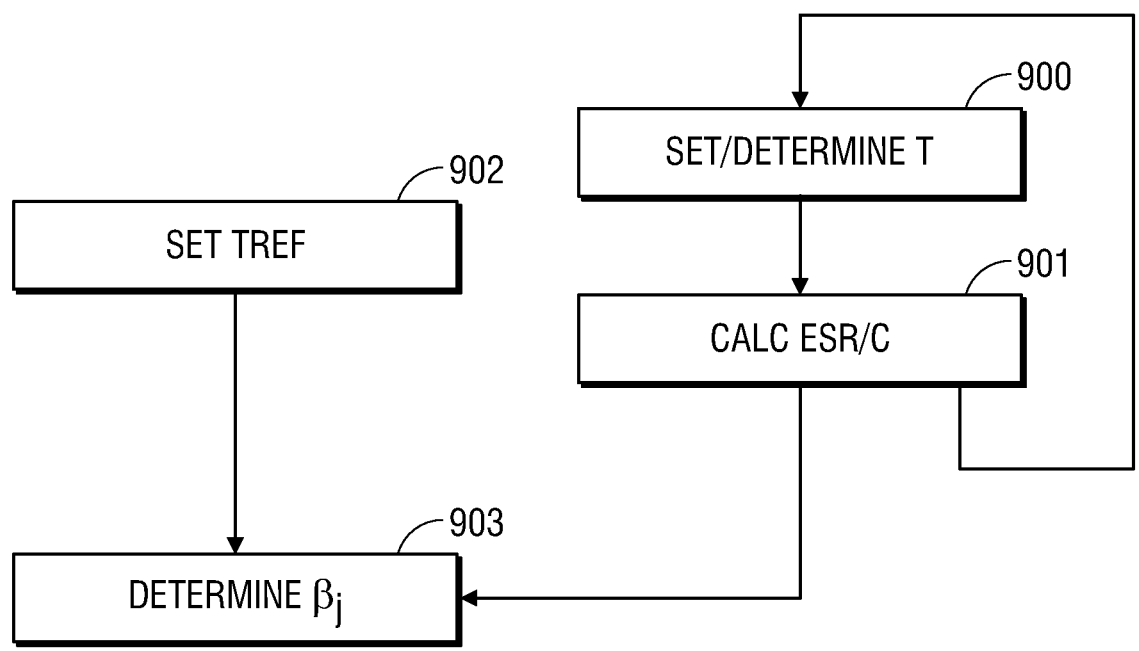
FIG. 9 is a flowchart showing operations to perform one of the steps illustrated on FIG. 3.

FIG. 9 is a flowchart showing operations to perform step 303 detailed above, according to some embodiments of the invention.

In particular, operations to obtain the values $\beta_j$ are represented.

As explained above, the following operations can be performed during a given period, such as a one-day period, which is short enough so that time does not influence the parameters ESR and C during that period. The period can therefore be comprised between several hours and several days (maximum one week for example).

At step 900, the capacitor 206 is under a given temperature T (for example a core temperature). This temperature can be controlled or can depend on the state of normal operation, as explained above.

At step 901, ESR and C are calculated as described above, and stored in association with the given temperature.

Steps 900 and 901 are repeated for different temperature values.

At step 902, a reference temperature is defined (such as 20° C., 25° C., or a maximum temperature for example). We assume that 20° C. is defined as reference temperature and is noted T20. The ESR and C values are normalized by being respectively divided by $ESR_{T20}$ and $C_{T20}$, which are ESR and T values for the reference temperature.

At step 903, the curve $$\frac{ESR_T}{ESR_{T20}}$$

depending on T is used to obtain values $\beta_1$, $\beta_2$ and $\beta_3$ may be such that $$\frac{ESR_T}{ESR_{T20}} = \beta_1 + \beta_2 e^{\frac{-T}{\beta_3}}$$

for example. Also, the curve $$\frac{C_T}{C_{T20}}$$

depending on T is used to obtain values $\beta_1$, $\beta_2$ and $\beta_3$ may be such that $$\frac{C_T}{C_{T20}} = \beta_4 + \beta_5 \cdot T.$$

A least square method may be used to determine the values $\beta_j$.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments.

The invention claimed is:

1. Method for determining a value representative of the remaining useful life, RUL, of a capacitor, the method comprising the following operations:
repeating for several iterations 1 to k, k being an integer greater than 1:
acquiring environment measurements that are representative of the environment of the capacitor at a current iteration of each of the several iterations;
based on previous environment measurements acquired at previous iterations 1 to k−1 before the current iteration, and on the received environment measurements at iteration k, calculating at least one calculated aging model based on a compressed time scale between two consecutive iterations of the several iterations estimating Equivalent Series Resistance or capacitance of the capacitor;
based on the at least one calculated aging model, determining the value representative of the RUL of the capacitor;
wherein duration between consecutive iterations of the several iterations is at a given frequency or are triggered by detection of an event; and
wherein the aging model comprises at least one impedance value and a time for each iteration, said impedance value being determined based on the current value and on the voltage value, and wherein the time, for each iteration i, is adjusted based on a temperature value, a current value and/or a voltage corresponding to iteration i and based on reference conditions.

2. The method according to claim 1, wherein the environment measurements comprise:
a temperature measurement in the vicinity of the capacitor;
a voltage measurement representative of a value of the voltage at terminals of the capacitor; and/or
a current measurement representative of a value of the current flowing through the capacitor.

3. The method according to claim 2, wherein, for each iteration, a core temperature of the capacitor is determined based on a measured ambient temperature in the vicinity of the capacitor, and wherein the aging model is determined based on the core temperature, based on the current value and/or based on the voltage value.

4. The method according to claim 2, comprising the estimation of an Equivalent Series Resistance, $ESR_i$, value and/or of a capacitance $C_i$ value, for each iteration i being comprised between 1 and k, wherein at least one aging model represents the evolution of the ESR value of the capacitor for iterations 1 to k and/or the evolution of the C value of the capacitor for iterations 1 to k, wherein the ESR value and/or the C value is obtained by filtering the value of the voltage at the terminals of the capacitor and the value of the current flowing through the capacitor.

5. The method according to claim 4, wherein the C value is obtained by applying a band-pass filter at low frequencies and/or the ESR value is obtained by applying a band-pass filter at middle frequencies.

6. The method according to claim 5, wherein the low frequencies include 120 Hz and wherein the middle frequencies include 15 kHz; or
wherein the low frequencies include 300 Hz and wherein the middle frequencies include 4 kHz.

7. The method according to claim 1, comprising the estimation of an Equivalent Series Resistance, $ESR_i$, value and/or of a capacitance $C_i$ value, for each iteration i, i being comprised between 1 and k, wherein at least one aging model represents the evolution of the ESR value of the capacitor for iterations 1 to k and/or the evolution of the C value of the capacitor for iterations 1 to k.

8. The method according to claim 7, wherein a first aging model represents the evolution of an ESR value of the capacitor for iterations 1 to k and a second aging model represents the evolution of the C value of the capacitor for iterations 1 to k.

9. The method according to claim 1, wherein the aging model comprises at least one impedance value and a time for each iteration, said impedance value being determined based on the current value and on the voltage value, and wherein the impedance value, for each iteration i, is adjusted based on a temperature value corresponding to iteration i and based on reference conditions.

10. The method according to claim 9, wherein the temperature value is a core temperature $T_{c,i}$ of the capacitor, calculated for each iteration i based on a temperature measurement $T_{amb,i}$ representative of the ambient temperature in the vicinity of the capacitor.

11. The method according to claim 10, wherein:

$$T_{c,i} = T_{amb,i} + \mathcal{R}_{th} \cdot I_{RMS,i}^2 \cdot ESR_i$$

wherein $I_{RMS}$ is a Root Mean Square value of the current flowing through the capacitor for iteration i;

$R_{th}$ is a thermal resistance of the capacitor; and $ESR_i$ is an Equivalent Series Resistance value of the capacitor for iteration i.

12. The method according to claim 10, comprising the estimation of an Equivalent Series Resistance, $ESR_i$, value and/or of a capacitance $C_i$ value, for each iteration i, i being comprised between 1 and k, wherein at least one aging model represents the evolution of the ESR value of the capacitor for iterations 1 to k and/or the evolution of the C value of the capacitor for iterations 1 to k, wherein, for each iteration i, the impedance value comprises the $ESR_i$ value and/or the $C_i$ value, and wherein the $ESR_i$ value and/or the $C_i$ value is adjusted according to a core temperature $T_{c,i}$ to determine adjusted value $ESR_{i,adjusted}$ and/or $C_{i,adjusted}$ based on:

$$ESR_{i,adjusted} = \frac{ESR_k}{\beta_1 + \beta_2 e^{\frac{-T_{c,i}}{\beta_3}}}$$

$$C_{i,adjusted} = \frac{C_k}{\beta_4 + \beta_5 \cdot T_{c,i}}$$

wherein $\beta_1$, $\beta_2$, $\beta_3$, $\beta_4$ and $\beta_5$ are constants.

13. The method according to claim 12, further comprising a preliminary phase of determining $\beta_1$, $\beta_2$, $\beta_3$, $\beta_4$ and $\beta_5$ by varying temperature conditions during a test period and performing current and voltage measurements during said test period.

14. The method according to claim 1, wherein the time for each iteration i is adjusted based on a combination of one or several of the following factors $K_{T,i}$, $K_{I,i}$, $K_V$ and $K_{TI,i}$:

$$K_{T,i} = 2^{\frac{T_0 - T_{x,i}}{10}};$$

$$K_{I,i} = K_r^{\left(1 - \left(\frac{I_{RM Sx,i}}{I_{RM S0}}\right)^2\right)\frac{\Delta T_0}{10}}$$

$$K_V = \left(\frac{V_0}{V_{x,i}}\right)^n$$

$$K_{TI,i} = e^{\frac{E_a}{kb}\left(\frac{1}{T_{x,i} + \Delta T_{x,i}} - \frac{1}{T_0 + \Delta T_0}\right)}$$

wherein $T_0$ is a reference temperature, $T_{x,i}$ is a core temperature of the capacitor for iteration i, $K_r$ is a factor that depends on $I_{RMSx,i}$, $I_{RMS0}$ is a reference value of current flowing through the capacitor, $I_{RMSx}$ is an actual value of current flowing through the capacitor for iteration i, $\Delta T_0$ is a predefined value of core temperature increase, $V_0$ is a reference value of voltage at the capacitor, $V_{x,i}$ is an actual value of voltage at the capacitor for iteration i, n is a predefined integer, $E_a$ is an activation energy of the capacitor, kb is the Boltzmann constant.

15. The method according to claim 1, wherein the at least one aging model is updated at each iteration i based on the previous ageing model determined at iteration i−1 and based on the environment measurements acquired at iteration i, and wherein the value representative of the RUL is determined after each iteration i, i being comprised between 1 and k.

16. The method according to claim 1, wherein the value representative of the RUL of the capacitor is determined by extrapolating values of the at least one aging model and by comparing the extrapolated values with at least one predetermined threshold.

17. The method according to claim 1, wherein the value representative of the RUL of the capacitor is:
    a ratio between the calculated RUL of the capacitor based on the aging model, and an estimated end of life based on the aging model; or
    a ratio between the calculated RUL of the capacitor based on the aging model, and a predetermined end of life.

18. The method according to claim 1, further comprising:
    comparing the value representative of the RUL with a predetermined threshold; and
    issuing an alarm based on the comparison.

19. The method according to claim 1, wherein the RUL of the capacitor is determined for reference conditions and wherein the value representative of the RUL:
    is directly derived from the RUL of the capacitor; or
    is derived from an actual RUL, noted $RUL_x$ obtained by adjusting the RUL of the capacitor, noted $RUL_0$, to actual conditions.

20. The method according to claim 19, wherein the reference conditions are set by a user.

21. A non-transitory computer readable storage medium, with a computer program stored thereon, said computer program comprising instructions for, when executed by a processor, carrying out the steps of a method according to claim 1.

22. A device for determining a value representative of the remaining useful life, RUL, of a capacitor, the device comprising a memory and a processor configured for:
    repeating for several iterations 1 to k, k being an integer greater than 1:
        acquiring, via at least one sensor or at least one communication interface, environment measurements that are representative of the environment of the capacitor at a current iteration of each of the several iterations;
    based on previous environment measurements acquired at previous iterations 1 to k−1 before the current iteration, and on the received environment measurements at iteration k, calculating at least one calculated aging model based on a compressed time scale between two consecutive iterations of the several iterations estimating Equivalent Series Resistance or capacitance of the capacitor;
    based on the at least one calculated aging model, determining the value representative of the RUL of the capacitor;
    wherein duration between consecutive iterations of the several iterations is at a given frequency or are triggered by detection of an event;
    wherein the aging model comprises at least one impedance value and a time for each iteration, said impedance value being determined based on the current value and on the voltage value, and wherein the time, for each iteration i, is adjusted based on a temperature value, a current value and/or a voltage corresponding to iteration i and based on reference conditions.

* * * * *